United States Patent
Hauser et al.

(10) Patent No.: US 7,709,996 B2
(45) Date of Patent: May 4, 2010

(54) METHOD AND DEVICE FOR CONTROLLING A CAPACITIVE LOAD

(75) Inventors: Christian Hauser, Regensburg (DE); Klaus Kiel, Regensburg (DE); Manfred Kramel, Regensburg (DE); Heinz Lixl, Regensburg (DE); Gabriel Marzahn, Lappersdorf (DE); Walter Schrod, Regensburg (DE)

(73) Assignee: Continental Automotive GmbH, Hannover (DE)

( * ) Notice: Subject to any disclaimer, the term of this patent is extended or adjusted under 35 U.S.C. 154(b) by 93 days.

(21) Appl. No.: 11/916,594

(22) PCT Filed: Jun. 6, 2006

(86) PCT No.: PCT/EP2006/062928
§ 371 (c)(1), (2), (4) Date: Jan. 16, 2008

(87) PCT Pub. No.: WO2006/131516
PCT Pub. Date: Dec. 14, 2006

(65) Prior Publication Data
US 2008/0211345 A1    Sep. 4, 2008

(30) Foreign Application Priority Data
Jun. 7, 2005  (DE) ........................ 10 2005 026 217

(51) Int. Cl.
*H01L 41/09* (2006.01)
(52) U.S. Cl. ................................. 310/316.03
(58) Field of Classification Search ............ 310/316.03, 310/317
See application file for complete search history.

(56) References Cited

U.S. PATENT DOCUMENTS

| | | | |
|---|---|---|---|
| 4,282,535 A * | 8/1981 | Kern et al. | 347/10 |
| 4,705,003 A * | 11/1987 | Sakakibara et al. | 123/449 |
| 6,204,591 B1 * | 3/2001 | Nariai | 310/316.03 |
| 6,563,252 B2 | 5/2003 | Schrod | 310/316.03 |
| 6,619,268 B2 * | 9/2003 | Rueger et al. | 123/490 |
| 6,853,114 B2 * | 2/2005 | Bachmaier et al. | 310/316.03 |

(Continued)

FOREIGN PATENT DOCUMENTS

DE    19854789    8/1999

(Continued)

OTHER PUBLICATIONS

Tietze-Schenk—Halbleiter-Schaltungstechnik 10. Aufl. Springer Verlag, ISBN 3-540-96184-6 (3 pages), 1993.

(Continued)

*Primary Examiner*—Thomas M Dougherty
(74) *Attorney, Agent, or Firm*—King & Spalding L.L.P.

(57) ABSTRACT

A tendency of the controlled load to oscillate when controlling a capacitive load can be avoided according to a piezo actuator for an injection valve of an internal combustion engine, having charging and discharging processes for charging and discharging the capacitive load by means of a load current, each loading process being effected by chronological partial load current pulses according to chronological partial charging capacity pulses (p1, p2, . . . pn), wherein the envelope (E) of the partial charging capacity pulses (p1, p2, . . . pn), during the loading process, increases in a strictly monotonous manner in an initial phase, and the slope of the envelope decreases in a monotonous manner.

20 Claims, 2 Drawing Sheets

U.S. PATENT DOCUMENTS

| | | | |
|---|---|---|---|
| 7,019,436 B2 | 3/2006 | Rueger | 310/316.03 |
| 2002/0093313 A1* | 7/2002 | Hoffmann et al. | 320/166 |
| 2004/0051421 A1* | 3/2004 | Montuschi et al. | 310/317 |
| 2005/0092297 A1* | 5/2005 | Takemoto et al. | 123/406.47 |
| 2007/0079811 A1* | 4/2007 | Nakane | 123/478 |
| 2007/0183114 A1 | 8/2007 | Augesky | 361/160 |

FOREIGN PATENT DOCUMENTS

| | | |
|---|---|---|
| DE | 19944733 | 3/2001 |
| DE | 19952950 | 6/2001 |
| DE | 10314566 | 11/2003 |
| DE | 102004009614 | 9/2005 |
| EP | 1138903 | 10/2001 |
| WO | 01/33061 | 5/2001 |

OTHER PUBLICATIONS

Search Report for International Application No. PCT/EP2006/062928 (4 pages), Sep. 4, 2006.

Office Action for German Application No. 102005026217.1-42 (7 pages), Jul. 4, 2007.

* cited by examiner

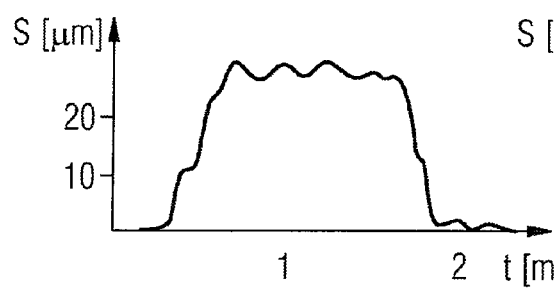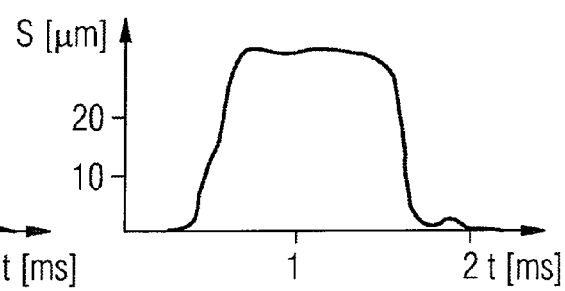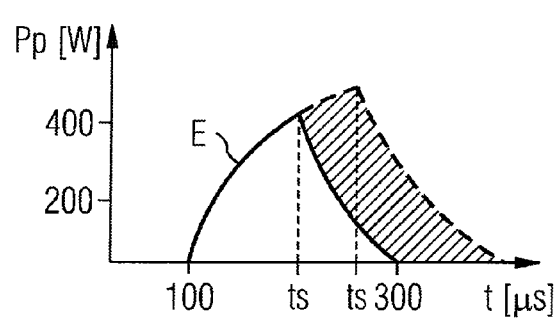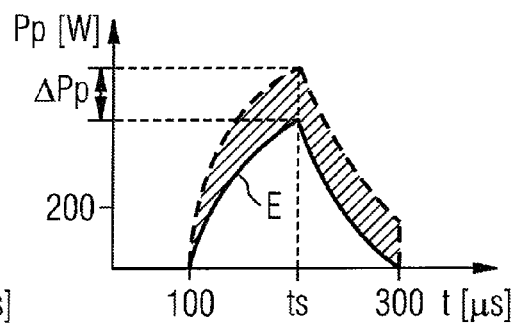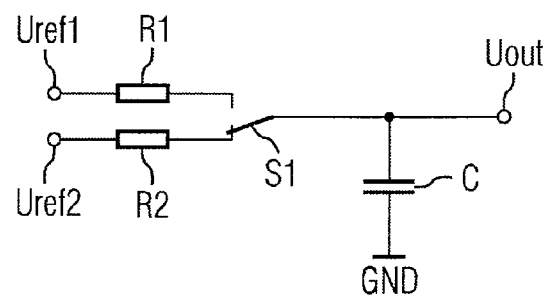

METHOD AND DEVICE FOR CONTROLLING A CAPACITIVE LOAD

CROSS-REFERENCE TO RELATED APPLICATIONS

This application is a U.S. national stage application of International Application No. PCT/EP2006/062928 filed Jun. 6, 2006, which designates the United States of America, and claims priority to German application number 10 2005 026 217.1 filed Jun. 7, 2005, the contents of which are hereby incorporated by reference in their entirety.

TECHNICAL FIELD

The present invention relates to a method for controlling a capacitive load, in particular a piezoelectric actuator for an injection valve of an internal combustion engine. The invention also relates to a device for carrying out such a control method.

BACKGROUND

Methods and devices of this kind are known for example from DE 199 44 733 A1, DE 198 14 594 A1 and DE 199 52 950 A1.

The recently tightened engine exhaust emission standards in particular have caused the motor vehicle industry to develop fuel injectors with fast and instantaneously operating final control elements or actuators. In terms of the practical implementation of such final control elements, piezoelectric elements (piezo actuators for short) have proved particularly advantageous. Piezoelectric elements of this kind are generally assembled as a stack of piezoceramic disks which are operated via a parallel electric circuit in order to be able to achieve the electric field strengths necessary for a sufficient displacement.

To control a capacitive load such as a piezo actuator which is used for actuating an injection valve, i.e. during charging and discharging of the capacitive load by means of a load current, considerable requirements are placed on the control electronics. An injection valve operated by a piezo actuator is used in internal combustion engines for injecting fuel (e.g. gasoline, diesel, etc.) into a combustion chamber. This places very exacting requirements on precise and reproducible opening and closing of the valve and therefore also on the control electronics, with voltages ranging up to several 100 V and, transiently, load currents for charging and discharging of more than 10 A having to be provided. Control mainly takes place in fractions of milliseconds. At the same time, the current and voltage must be fed to the actuator in as controlled a manner as possible during these charging and discharging processes.

DE 199 44 733 A1 discloses a circuit arrangement for controlling a piezo actuator in which the actuator is charged by a charging capacitor via a transformer. For this purpose a charging switch disposed on the primary side of the transformer is controlled by a pulse width modulated control signal. Both the charging switch and the discharging switch are implemented there as controllable semiconductor switches. Predefined energy packets are fed to and removed from the piezo actuator during charging and discharging respectively. The disclosed arrangement is based on the principle of a "bidirectional flyback converter" and allows precise apportioning of energy during charging and discharging of the piezo actuator.

DE 198 14 594 A1 describes a circuit arrangement for charging and discharging a single piezoelectric element. The control circuit disclosed is based on a half-bridge output stage which controls the piezo element via an inductor (choke), said choke being used primarily to limit the charging current occurring during charging and the discharging current occurring during discharging. Charging and discharging take place in a pulsed manner, i.e. by repeated opening and closing of a charging switch during charging and of a discharging switch during discharging, respectively. This again allows precise apportioning of energy during charging and discharging of the piezo actuator.

DE 199 52 950 A1 discloses a control unit for a piezo actuator in which the piezo actuator is controlled by an output stage designed as a "flyback converter". The flyback converter with transformer used here enables the electrical energy supplied during the charging process to be largely recovered during discharging, temporarily stored in the converter and reused for the subsequent charging process. To charge the piezo actuator, a charging switch connected in series with the primary side of the transformer is operated intermittently. When the charging switch is closed, the current flowing on the primary side is compared with a reference current value. When the primary current attains the reference current value, the charging switch is opened again. This process is carried out repeatedly, so that each charging operation is effected by consecutive (secondary side) partial charging current pulses corresponding to consecutive partial charging power pulses. The time integral of each secondary-side partial charging power pulse represents an energy pulse on the secondary side of the transformer, the value of which is defined by the prevailing reference current value. In a first embodiment (FIG. 2,) the reference current value is set to a constant value during the charging process so that, on the secondary side, consecutive pulses of constant energy for charging the piezo actuator are generated. In another embodiment (FIG. 3), the charging process is started with a relatively large energy pulse which is followed by successively smaller energy pulses. In yet another embodiment (FIG. 4), an essentially cosine waveform of the reference current value is specified.

The problem with comparatively fast control of the capacitive load, as is required particularly for actuating an injection valve of an internal combustion engine, for example, is the risk of post-oscillation of the actuator because of mechanical and/or electrical resonances at the end of each charging or discharging process. When an actuator is controlled in such a way that a charging phase is followed by a holding phase and finally by a discharging phase, this may result in e.g. post-oscillation in the holding phase and/or discontinuities during activation or deactivation of the actuator. These effects are more pronounced the more rapidly the charging and discharging processes brought about by the pulsed current flow take place. In addition, many capacitive loads in practice possess a variable large signal capacitance or nonlinearities, which makes it difficult to achieve a particularly well defined energy input or output response and tends to increase and complicate the abovementioned oscillation or post-oscillation effects. When the capacitive load is a piezo stack, not only nonlinearities but also polarization losses and creep effects, etc. occur. Finally, for controlling an actuator for an injection valve of an internal combustion engine, transfer function effects of other coupling elements (e.g. hydraulic converters, hydraulic backlash compensation, levers, coupling rods, etc.) are also present.

SUMMARY

The post-oscillation tendency of the controlled load can be reduced according to an embodiment, by a method for controlling a capacitive load comprising the steps of: charging and discharging respectively of the capacitive load by means of a load current, wherein the step of charging is effected by consecutive partial charging current pulses corresponding to consecutive partial charging power pulses, wherein, during the step of charging, the envelope of the partial charging power pulses rises strictly monotonically in an initial phase in which the slope of the envelope falls off monotonically, and wherein during the step of charging, a maximum of the envelope is reached at a time instant which is spaced 30% to 70% of the duration of a charging process away from the start of the charging process.

According to a further embodiment, during the charging process, the envelope of the partial charging power pulses may fall strictly monotonically in an end phase in which the slope of the envelope increases monotonically. According to a further embodiment, the initial phase of the charging process may immediately be followed by the end phase of the charging process. According to a further embodiment, more than 10 partial charging current pulses can be provided for the charging process. According to a further embodiment, the load current can be produced by smoothing a transformer secondary current. According to a further embodiment, the slope in the initial phase of the charging process may decrease by at least a factor of 2. According to a further embodiment, during the charging process, the absolute value of a maximum of the envelope may be operationally variable in order to set a total charging energy. According to a further embodiment, during the charging process, a maximum of the envelope can be reached at a time which is operationally variable in order to set a total charging energy. According to a further embodiment, both in the initial phase of the charging process and in the end phase of the charging process, the envelope may possess an essentially exponential shape. According to a further embodiment, each discharging process may be effected by consecutive partial discharging current pulses corresponding to consecutive partial discharging power pulses, and during the discharging process, the envelope of the partial discharging power pulses may fall strictly monotonically in an initial phase while the slope of the envelope increases monotonically. According to a further embodiment, for controlling a piezo actuator for an injection valve of an internal combustion engine, fuel injection may take place during an injection interval in an injection sequence comprising a plurality of individual injections. According to a further embodiment, for controlling a piezo actuator for an injection valve of an internal combustion engine, closed-loop injection quantity control can be provided in which a deviation between a wanted fuel injection quantity and an actual fuel injection quantity is measured and taken into account for a subsequent injection for the control thereof.

According to another embodiment, a device for controlling a capacitive load may comprise means for charging and discharging respectively of the capacitive load by a load current, wherein the means are operable to effect the charging by consecutive partial charging current pulses corresponding to consecutive partial charging power pulses, and the means are further operable to charge such that the envelope of the partial charging power pulses rises strictly monotonically in an initial phase in which the slope of the envelope falls off monotonically, and a maximum of the envelope is reached at a time instant which is spaced 30% to 70% of the duration of a charging process away from the start of the charging process.

According to a further embodiment, the device may further comprise means for specifying a time-dependent partial charging energy setpoint value during the charging process and an output stage for generating the partial charging power pulses of the load current whose energy corresponds to the currently specified partial charging energy setpoint value. According to a further embodiment, the means for specifying the time-dependent partial charging energy setpoint value may comprise an RC element to which a reference voltage is applied.

BRIEF DESCRIPTION OF THE DRAWINGS

The invention will now be described in greater detail on the basis of exemplary embodiments and with reference to the accompanying drawings, in which:

FIG. 4a shows the time characteristic of the actuator stroke in the case of conventional actuator control, FIG. 4b shows the time characteristic of the actuator stroke in the case of actuator control according to an embodiment, FIG. 5a shows a diagram illustrating how the total charging energy can be varied by varying a changeover point between an initial phase and an end phase of the charging process, FIG. 5b shows a diagram illustrating how the total charging energy can be varied by varying the absolute value of an envelope maximum during the charging process, and FIG. 6 shows a general circuit diagram illustrating how exponential characteristics of the kind used to form the charging or discharging characteristic can be produced using simple circuitry.

DETAILED DESCRIPTION

Figure 1:
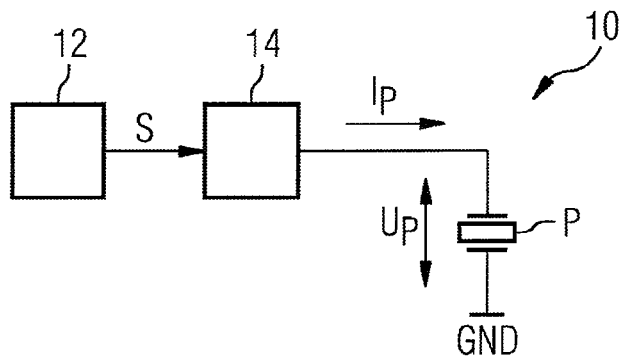
FIG. 1 shows a block diagram of a device for controlling a piezo actuator.

It is provided according to various embodiments that, during the charging process, the envelope of the partial charging power pulses rises strictly monotonically in an initial phase and the slope of the envelope falls off monotonically in this phase. An essential feature of this initial phase of the "power curve" is that the change with respect to time on the one hand and the change with respect to time of the slope on the other are of opposite sign.

It has been found that a rising edge of the power curve (envelope) shaped in this way substantially reduces the tendency to post-oscillation at the start of the pulsed charging process. In addition, the uniformity of the energy input during the charging process is also improved.

Circuit concepts known per se, whereby an appropriate output stage is operated in a pulsed manner to generate the load current, are basically suitable for implementing the power curve shape according to various embodiments in terms of circuitry. In such output stages or switch-mode converters, inductive elements are mainly used to charge the capacitive load in a controlled manner (e.g. flyback, buck-boost or SEPIC converters). The charging process in this case is composed of a plurality of individual partial charging processes, each partial charging process representing a partial charging current pulse flowing to the load or a partial charging power pulse transmitted to the load. During operation according to an embodiment of such an output stage, the transferred energy of the individual partial charging power pulses varies in the above described manner in the initial phase of each charging process.

In a preferred embodiment it is provided that, during the charging process, the envelope of the partial charging power pulses falls off strictly monotonically in an end phase and the slope of the envelope increases monotonically in this phase. In this case, the envelope of the partial charging power pulses overall (viewed over initial and end pulses) has approximately the shape of a shark fin, thereby enabling the abovementioned disadvantageous effects to be reduced still further. This is based on the fact that, also for the end phase of the charging process, a time characteristic of the envelope is then present in which the change with respect to time and the change of the slope with respect to time are constant and of opposite sign.

In this case the end phase can follow the initial phase of the charging process immediately. Alternatively, between the end of the initial phase and the start of the end phase another phase can be provided in which the slope of the envelope is preferably constant. Such a constant slope can possess e.g. the value 0 or a value corresponding to the slope at the end of the initial phase.

In a preferred embodiment, more than ten partial charging current pulses (and correspondingly more than ten partial charging power pulses) are provided for the charging process. Preferably at least 30% of these pulses are allotted to the initial phase of the charging process. If the abovementioned end phase is provided, likewise at least 30% of the pulses are allotted to said end phase.

Preferably the individual partial charging current pulses or partial charging power pulses are subject to a periodic pattern, i.e. follow one another in a periodic time sequence.

In one embodiment, it is provided that, during the charging process, the load current for the capacitive load is provided by smoothing partial charging current pulses or partial charging power pulses induced on the secondary side of a transformer, it additionally being preferred that, for this purpose, a pulsed primary current be applied to the primary side of the transformer, said primary current falling sharply between primary current pulses, e.g. essentially to 0 or e.g. to a value in the range +/−10% of the previous current maximum in the primary current.

In respect of reducing the post-oscillation tendency, it has been found advantageous if the slope of the envelope decreases by at least a factor of 2 in the initial phase of the charging process.

In a preferred embodiment, an envelope maximum during the charging process is reached at a point in time which is spaced 30% to 70% of the duration of the charging process away from the start of the charging process. This means that a certain minimum spacing between the "power curve" maximum and both the start and end of the charging process is ensured, thereby enabling an extremely rapid rise to the maximum or an extremely rapid fall after the maximum to be avoided, particularly if, also for the end phase, the shape of the envelope is such that the change in the value of the envelope and the change in the slope of the envelope are of opposite sign.

In practice it is often desirable to set the total charging energy, i.e. the energy stored in the load during a charging process. According to various embodiments, two possibilities have been found to be particularly advantageous for this purpose. On the one hand it can be provided that the absolute value of an envelope maximum attained during the charging process is operationally variable. On the other, alternatively or in addition, the point in time at which an envelope maximum is reached during the charging process can be operationally variable. In both cases, the envelope maximum can be attained e.g. at the end of the initial phase of the charging process.

The particular rise of the envelope provided according to an embodiment in the initial phase of the charging process can be provided, for example, in an essentially exponential manner. An essentially exponential shape of this kind is also suitable for implementing the above described end phase of the charging process (but then falling instead of rising). In one embodiment, the envelope possesses an essentially exponential shape both in the initial phase of the charging process and in the end phase of the charging process. As will be explained below, exponential partial shapes of the envelope also possess the practical advantages of simple implementability in terms of circuitry.

According to an embodiment, it is provided that each discharging process is effected by consecutive partial discharging current pulses corresponding to consecutive partial discharging power pulses, the envelope of the partial discharging power pulses during the discharging process falling strictly monotonically in an initial phase and the slope of the envelope increasing monotonically in this phase.

This means that the initial phase of the discharging process possesses a quality (power curve shape) corresponding to the initial phase of the charging process, namely with a strictly monotonic rise of the envelope in absolute value terms with the slope simultaneously decreasing monotonically in absolute value terms. According to various embodiments, the advantages described for the charging process also apply to the discharging process, as the discharging of the load is to some extent the opposite (reverse) process to its charging. In practice, however, the charging process or rather a reduction of discontinuities or oscillation during and immediately after the charging process, is often of greater relevance. This is the case, for example, when the capacitive load is an actuator of an injection valve of an internal combustion engine. In this case, e.g. post-oscillation of the actuator after the charging phase (i.e. in a more or less lengthy holding phase of the actuator, for example) is very problematic in connection with injection quantity regulation when it comes to determining (e.g. detecting) the actual characteristic of the injection valve stroke, particularly the time of attaining full opening and the start of the valve closing process (at the end of the holding phase). Particularly oscillations of the actuator stroke in the holding phase can considerably reduce the validity of an actual value measurement of this kind. In comparison, post-oscillation at the end of the discharging process is of lesser significance in practice, as at this time the injection valve is closed and remains closed even in the event of post-oscillation of the actuator stroke (provided the amplitude is not excessive). In other words, in the case of an actuator-operated fuel injection valve, uncontrollable or more precisely ill-defined oscillations are more problematic the larger the current actuator stroke or injection valve stroke (or control valve stroke in the case of a servo valve).

Although the discharging process is therefore less relevant for load control in the special case of controlling an injection valve actuator, all the embodiments or developments described above for the charging process can also be used quite generally for the discharging process in order to improve the control action still further.

To some extent the envelope of the partial discharging power pulses can essentially be a "point symmetric version" of the envelope of the partial charging power pulses, all the development aspects described in claims 2 to 11 being implementable (taking into account the "opposite sign for discharging").

Thus, for example, during the discharging process the envelope of the partial discharging power pulses can rise strictly monotonically in an end phase, with the slope of the envelope decreasing monotonically (cf. claim 2).

A particularly preferred use of the various embodiments is that of controlling a piezo actuator for an injection valve of an internal combustion engine, particularly with fuel injection during an injection interval in an injection sequence comprising a plurality of individual injections, the term "injection interval" referring to the period of time in the (cyclical) operation of the internal combustion engine in which fuel is to be supplied to the combustion chamber. In this injection interval, e.g. one or more main injections (in the case of an internal combustion engine of conventional design e.g. at a crankshaft angle of 0° TDC) can take place, whereas one or more possibly provided pre-injections and/or post-injections can take place appreciably before or after the main injection or injections. Another typical characteristic of the pre- and post-injections is their much lower maximum value of the individual injection quantity compared to a main injection. This in turn means a typically much greater maximum value of the injection valve opening time (injection time) for main injections compared to pre- and post-injections. The accuracy of the quantity of fuel injected in an injection interval can be significantly improved using the various embodiments.

The reduction in the tendency to oscillate of the valve drive, for example, that can be achieved according to an embodiment already increases per se the accuracy of fuel metering. The use of the various embodiments in conjunction with injection quantity control in which a deviation between a required fuel injection quantity and an actual fuel injection quantity is measured and taken into account for a subsequent injection for the control thereof, offers the additional advantage that the actual fuel injection quantity tends to be more precisely measured, which ultimately further increases the fuel metering accuracy.

A preferred device for carrying out the method according to an embodiment comprises means for specifying a time-dependent partial charging energy setpoint value during the charging process and an output stage for producing the partial charging power pulses of the load current whose energy corresponds to the currently specified partial charging energy setpoint value.

According to a preferred concept, in the output stage, current is applied to an inductor at least during a charging process, said current being allowed to fluctuate (e.g. periodically) between a minimum value (e.g. at least approximately 0) and a maximum value, the partial charging energy setpoint value specified on a time-dependent basis corresponding to the maximum current. This means that each time current is applied to the inductor, energy is stored therein which is proportional to the square of the maximum current value. This energy temporarily stored in the inductor is, according to the concept, then reversed with respect to the capacitive load directly or indirectly (via an inductively coupled second inductor) and via a smoothing output filter. A time characteristic according to an embodiment of the partial charging energy setpoint value or of the maximum current value (e.g. exponential) then allows the load to be supplied with power, the characteristic of which possesses the required shape (e.g. again exponential).

The output stage used here can be implemented in a variety of ways. Suitable circuit concepts will be generally known to the person skilled in the art. In one embodiment, the output stage is implemented, for example, as a buck-boost converter. Here a charging switch and a discharging switch can be disposed as a half-bridge between the terminals of a supply voltage source in order to adjust a load control voltage at a tap between the switches, which voltage is applied to the capacitive load e.g. via a current-limiting component (e.g. choke coil). When using semiconductor switches for the charging and discharging switches, these are embodied e.g. as power MOS field effect transistors (MOSFETs) or as insulated gate bipolar transistors (IGBTs). A suitable control signal is then applied to the control terminals of these semiconductor switches by a control unit, so that the envelope of the partial charging power pulses (and possibly of the partial discharging power pulses) possesses the special shape described above.

If the envelope of the charging process and/or the envelope of the discharging process is to possess an exponentially shaped segment, this segment can be particularly easily implemented in terms of circuitry if the means for specifying the time-dependent partial charging energy value include an RC element with a predefined voltage applied.

FIG. 1 shows a block diagram of a circuit 10 for controlling a piezo actuator P which is connected to an output stage 14 of the circuit 10. The output stage 14 supplies a current Ip for charging and discharging the piezo actuator P.

The output stage 14 can be implemented as a conventional switch-mode converter, i.e. as a buck-boost, flyback or SEPIC converter, and supplies the current as a function of a control signal S (e.g. one or more control voltages) which is provided by a control unit 12 of the circuit 10 on the basis of a control input and taking account of measured values which are determined in the region of the output stage 14 and/or the region of the piezo actuator P (e.g. piezo voltage Up and/or piezo current Ip).

The circuit 10 forms part of a so-called engine control unit for an internal combustion engine and is used for controlling a plurality of piezo actuators of a fuel injection system. For the sake of simplicity of representation, only one of the piezo actuators P requiring to be controlled by charging and discharging is shown in FIG. 1. In a manner well-known per se, a plurality of injectors can be controlled using an output stage or a so-called "bank" of an output stage, e.g. by disposing selector switches in the line connection between the output stage and the individual piezo actuators P.

To generate an injection, the electrical output stage 14 must charge the piezo actuator P of the relevant injector (charging process), then leave this electric charge in the actuator for a certain time (holding phase) and then discharge the actuator again (discharging process). In the exemplary embodiment shown, the potential of a negative actuator terminal ("lowside") of the actuator selected by means of a selector switch (not shown) is held at electric ground potential GND during the injection, whereas a positive actuator terminal ("highside") possesses a variable potential during the charging process and discharging process. The positive actuator terminal is typically brought to a voltage of e.g. 150 V referred to the negative actuator terminal during the charging process. The associated lengthening of the piezo ceramic is mainly not used directly for operating the actual fuel injection valve, but acts on a so-called control valve by means of which the hydraulic pressure ratios in the region of an injection valve body (nozzle needle) can be varied in order to be able to actuate said valve body hydraulically by means of the pressure of the fuel fed to the injector (servo principle).

To reduce pollutants and engine noise and to increase engine performance, it is desirable that the injectors can inject both very small, precisely measured and also very large fuel injection quantities into the combustion chamber of the internal combustion engine in question, even after many operating cycles. The fuel to be injected in the injection interval of the internal combustion engine in question is also mainly injected in an injection sequence comprising a plurality of individual injections (pre-injections, main injections and post-injections).

The tight quantity tolerances demanded in practice are best implemented by means of a closed control loop in which the injection quantity is measured e.g. indirectly by means of a suitable sensor and the control parameters are adapted accordingly for the next injection.

The control unit 12 effects pulsed operation of the output stage 14 in such a way that each charging process and each discharging process is composed of many individual partial charging processes and partial discharging processes respectively. The resulting high frequencies permit the use of smaller and cheaper reactive elements in the region of the output stage 14.

Figure 2:
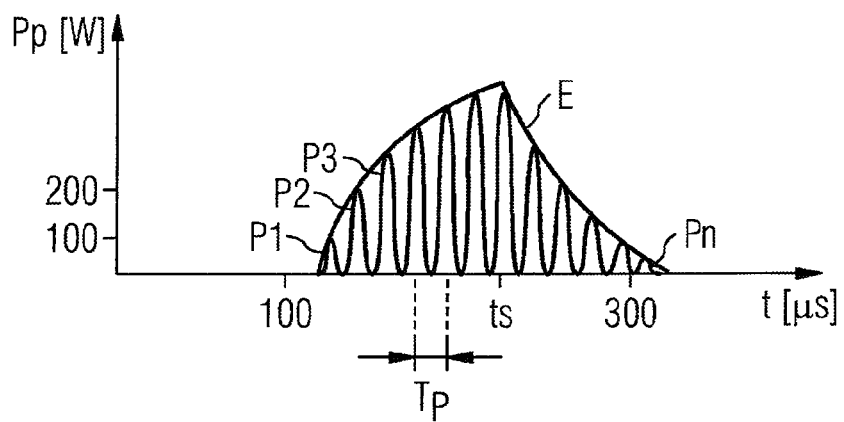
FIG. 2 shows the time characteristic of partial charging power pulses and their envelope in the case of a charging process.

FIG. 2 illustrates the time sequence of partial charging power pulses p1, p2, ... pn, the totality of which (n pulses) produces a charging power response which can be most simply characterized by the envelope E of the individual partial charging power pulses. In the example shown, these individual power pulses or current pulses follow one another with a fixed period Tp.

In this case the envelope E of the charging power pulses p1, p2, ... pn possesses a particular shape with two different time phases before and after a "changeover instant" ts:

In an initial phase, the envelope E rises strictly monotonically during the charging process, the slope of the envelope E falling off monotonically at the same time. This initial phase ends at ts with a slope which is reduced by approximately a factor of 10 compared to the slope with which the charging process began.

At the end of the initial phase (at ts), the envelope E attains a maximum which is immediately followed by an end phase of the charging process in which the envelope E falls strictly monotonically, the slope of the envelope E increasing monotonically at the same time.

During the charging process, the envelope E as a whole therefore possesses approximately the shape of a shark fin, in the example shown the initial phase (leading edge) and end phase (trailing edge) each being formed from approximately half of the power pulses p1, p2, ... pn.

By means of a filter (e.g. passive low-pass filter) not shown in FIG. 1 at the output of the output stage 14, a degree of smoothing of the current or power pulses shown in FIG. 2 is provided when the piezo actuator P is energized, but with the envelope of the "power curve" or the "time-averaged power" measurable at the piezo actuator P still retaining the above-described quality (shark fin).

Figure 3:
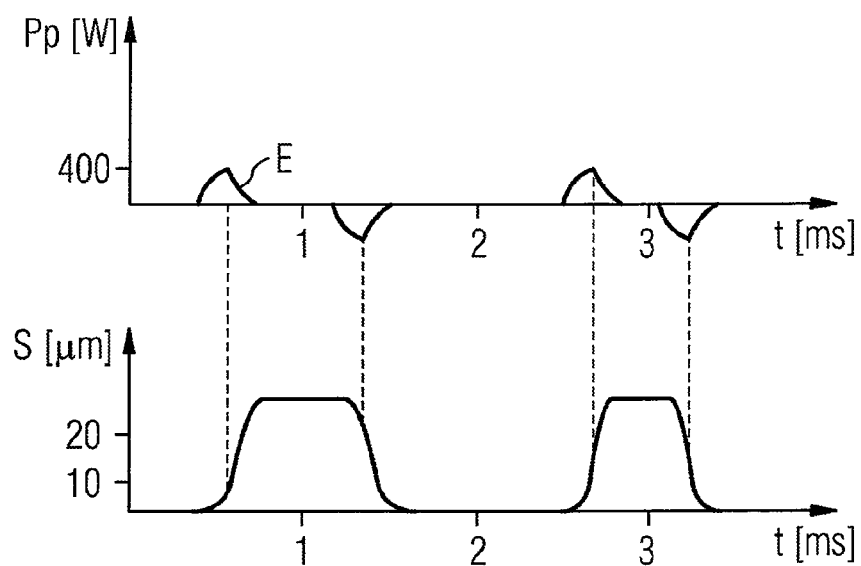
FIG. 3 shows the time characteristic of a plurality of charging and discharging processes in which both the envelopes of the power pulses (FIG. 3 upper) and the resulting strokes (FIG. 3 lower) of the piezo actuator are illustrated.

FIG. 3 shows the time characteristic of the power applied to the piezo actuator P over a longer period in which two injections (e.g. main injections of an injection sequence) take place. In the upper part of FIG. 3 the output stage power Pp is plotted against time t (envelope E), whereas in the lower part of FIG. 3 the resulting stroke s of the piezo actuator P is plotted as a function of time t.

The first individual injection is initiated by a power pulse sequence by selecting an envelope E of the type described with reference to FIG. 2. After a time duration (holding phase) predetermined by the control unit 12, pulsed discharging of the actuator P occurs with an envelope of the partial discharging power pulses, which essentially constitutes a point symmetric version of the above-described envelope E for charging. The charging process, holding phase and discharging process produce the actuator stroke characteristic s(t) schematically illustrated in the lower part of FIG. 3 which occurs a second time in the period shown.

Selecting the "shark fin shape" for the charging and discharging characteristics advantageously produces a reduction in the tendency to oscillation in the actuator stroke s(t) as a result of the pulsed control principle. This advantageous effect compared to a conventional (e.g. rectangular) shape of the power curve during charging is schematically illustrated by means of FIGS. 4a and 4b.

FIG. 4a schematically illustrates the time-dependent response of the actuator stroke s(t) for conventional pulsed control. It can be seen that this manipulated variable s is overlaid both during the rise (charging process) and also thereafter (holding phase) by a more or less large oscillation which has a negative effect on the accuracy of fuel metering for the injection and also on the measuring accuracy of the actual injection quantity of that injection.

In comparison, FIG. 4b schematically illustrates the time-dependent actuator stroke s(t) for control according to an embodiment using shark-fin-shaped envelopes of the power pulse sequences during the charging and discharging processes. It can be seen that in particular the discontinuities in the charging phase (increase of s(t)) and the post-oscillation amplitude in the holding phase (plateau of s(t)) are reduced, thereby improving the fuel metering accuracy, particularly when using closed loop fuel quantity control.

FIGS. 5a and 5b illustrate two possibilities for varying the total charging energy with which the piezo actuator P is charged at the end of the charging process.

The possibility shown in FIG. 5a consists of operationally varying the point in time (changeover instant ts) at which the maximum of the envelope E is attained. In this case the duration of the initial phase of the charging process is variable. The dashed line in FIG. 5a represents a second charging power curve for which the changeover time has been moved back from ts to ts' and the end phase (trailing edge) begins correspondingly later. The shaded area in FIG. 5a characterizes the increase in the total charging energy resulting from this shifting of the changeover time. If required, the total charging time can be left unchanged by continually "cutting off" the power curve Pp(t) after a specified total time (not shown in FIG. 5a).

In the case of the possibility shown in FIG. 5b, the absolute value of the maximum of the envelope E is operationally varied (while retaining the changeover instant ts). This means that the absolute value of the power Pp is varied both in the initial phase and in the end phase of the charging process. This is illustrated in FIG. 5b using the example of a dashed-line envelope whose maximum has been increased by an amount ΔPp. The shaded area again characterizes the associated increase in the total charging energy achieved at the end of the charging process. To ensure an unchanged total charging time, in the example shown the power curve of Pp(t) is cut off after a specified total time.

The possibilities shown in FIG. 5a and FIG. 5b for varying the total charging energy, whether it be e.g. for representing different injection quantities for a pre-injection and a main injection or different injection quantities for main injections of different injection intervals, can of course also be combined with one another. Advantageously, the shark fin shape of the envelope E can be largely retained here irrespective of the total charging energy set.

If, in order to increase the total charging energy, the changeover instant ts is shifted backward with the total charging time remaining unchanged, only the leading edge of the shark fin of the charging is sampled at some point. Although this changes the actuator stroke characteristic, which may adversely affect e.g. detection of the voltage sensor signals in the holding phase of an injector, it must be borne in mind that higher total charging energies (and therefore e.g. a backward-shifted changeover instant) are generally only required in the case of comparatively high fuel pressures (e.g. "rail pressure" in the case of a so-called common rail system) at which the voltage sensor signals are more pronounced anyway and can therefore often be sufficiently well analyzed in spite of actuator post-oscillation. In this way, using a variable current shape or power curve which can be smoothly varied between a "shark fin with rising and falling leg" and a "shark fin with rising leg only", the dynamics of the energy adjustment range can be increased and at the same time the advantages of the "complete shark fin" can be utilized at low energy levels. This means that the current shape can therefore be adapted to suit the particular requirements of the operating point currently being used.

The edge shapes of the envelope E to be defined in the region of the control unit 12 (FIG. 1) or their scaling (e.g. as shown in FIGS. 5a and 5b) can each possess, for example, an exponential form.

Exponential shapes of the envelope edges can be very easily produced in terms of circuitry e.g. using an RC element. This will now be explained with reference to FIG. 6.

FIG. 6 shows a circuit block for defining a signal (Uout) which exhibits the shark fin shape of the above-described envelope E during the charging process.

The circuit block comprises two parallel connected resistors R1 and R2, to the first terminals of which fixed reference voltages Uref1 and Uref2 respectively are applied. The second terminals of the resistors R1, R2 are optionally connected to a first terminal of a capacitor C by means of a controllable switching element S1 which is in practice implemented by means of a transistor arrangement, the second terminal of the capacitor being connected to electrical ground GND. The signal waveshape Uout is provided at the first terminal of the capacitor C.

At the start of the charging process, the changeover switch S1 is in the switch position shown in FIG. 6. The second reference voltage Uref2 is selected e.g. as 0 V (electrical ground GND) so that the output voltage Uout is 0 V. The charging process begins with the changeover of the switch S1 to the position in which the capacitor C is connected to the first reference voltage Uref1 via the resistor R1. This results in an exponential increase in the voltage Uout dropped across the capacitor C (initial phase of the charging process). At the abovementioned changeover instant ts, the switch S1 is reset to the switch position shown in FIG. 6 so that the charge stored in the capacitor C flows back via the second resistor R2 and the voltage Uout dropped across the capacitor C reduces again exponentially, thereby producing the above-described shark fin shape of the output voltage Uout. The time constants of the exponential edges are determined by the values of the reference voltages, resistors and capacitor.

In the circuit block according to FIG. 6, the scalings of the envelope E described above with reference to FIG. 5a and FIG. 5b can be implemented by a corresponding variation (scaling) of the reference voltage Uref1 or a shifting of the changeover instant ts of the switch S1.

In a variant it is provided that the second reference voltage Uref2 is scaled in conjunction with the first reference voltage Uref1. This can be performed e.g. by tapping off Uref2 at a voltage divider to which Uref1 is applied. For example, the voltage divider can be dimensioned such that Uref2 corresponds to a small fraction of Uref1, e.g. approximately 1/10 Uref1. The reference voltages are preferably provided at low resistance or at the output of a buffer amplifier (or following voltage divider) provided for that purpose.

If the voltage Uout at the output of the circuit block shown in FIG. 6 is to represent the envelope E of the partial charging power pulse sequence p1, p2, . . . pn, this signal must finally be used in a suitable manner to control the output stage 14. This can be simply implemented e.g. for an output stage comprising a transformer (e.g. according to the flyback principle) by using the signal Uout (preferably again passed via an impedance-increasing buffer amplifier) for defining an envelope of current pulses on the primary side of the transformer (e.g. as a maximum current setpoint value of a primary current fluctuating between a minimum and a maximum). The exponential edges of such a primary-side current pulse envelope then produce, on the secondary side, qualitatively corresponding power pulse envelope edges which are produced by the transformer and fed to the piezo actuator P via a smoothing output filter.

To summarize, the control arrangement according to an embodiment has the advantage of comparatively robust shaping of a desired characteristic of the actuator stroke s(t) and therefore e.g. of the control valve stroke in a servo injection valve of an injection system. In the latter field of application, the following advantages in particular emerge:

- Reduced discontinuities and oscillations in the elongation of the piezo actuator ensure more precise opening of the control valve, longer actuator service life and less injector noise.
- Reduced post-oscillation of the control valve in the holding phase allows easier detection of sensor effects in current and voltage and prevents disturbances of the pressure ratios in the control cavity of the injector.
- Reduced post-oscillation of the control valve reduces unwanted so-called "shot-to-shot" quantity variations, as the start of the discharging process is not affected by the holding phase oscillation.
- More stable closing of the control valve ensures more precise injection quantities, a longer actuator service life and less injector noise.
- The shaping of the charging or discharging power is generally simple to implement in terms of circuitry, e.g. by combining exponential functions. In addition, the charging or discharging waveshape can be adapted to the instantaneously required energy during operation, without thereby changing the advantageous characteristic of the waveshape.
- Easily implementable, operationally variable waveform shaping creates a large dynamic of the energy adjustment range. This allows, for example, the operation of similarly operating proportional valves and/or enables the usable actuator stroke to be increased.

What is claimed is:

1. A method for controlling a capacitive load comprising the steps of:
  charging and discharging respectively of the capacitive load by means of a load current,
    wherein the step of charging is effected by consecutive partial charging current pulses corresponding to consecutive partial charging power pulses,
    wherein, during the step of charging, the envelope of the partial charging power pulses rises strictly monotonically in an initial phase in which the slope of the envelope falls off monotonically and wherein during the step of charging, a maximum of the envelope is reached at a time instant which is spaced 30% to 70% of the duration of a charging process away from the start of the charging process.

2. The method according to claim 1, wherein, during the charging process, the envelope of the partial charging power pulses falls strictly monotonically in an end phase in which the slope of the envelope increases monotonically.

3. The method according to claim 1, wherein the initial phase of the charging process is immediately followed by the end phase of the charging process.

4. The method according to claim 1, wherein more than 10 partial charging current pulses are provided for the charging process.

5. The method according to claim 1, wherein the load current is produced by smoothing a transformer secondary current.

6. The method according to claim 1, wherein the envelope is shaped such in the initial phase of the charging process that the slope of the envelope decreases by at least a factor of 2.

7. The method according to claim 1, wherein, during the charging process, the absolute value of a maximum of the envelope is operationally variable in order to set a total charging energy.

8. The method according to claim 1, wherein, during the charging process, a maximum of the envelope is reached at a time which is operationally variable in order to set a total charging energy.

9. The method according to claim 1, wherein, both in the initial phase of the charging process and in the end phase of the charging process, the envelope possesses an essentially exponential shape.

10. The method according to claim 1, wherein each discharging process is effected by consecutive partial discharging current pulses corresponding to consecutive partial discharging power pulses, and wherein, during the discharging process, the envelope of the partial discharging power pulses falls strictly monotonically in an initial phase while the slope of the envelope increases monotonically.

11. The method according to claim 1, for controlling a piezo actuator for an injection valve of an internal combustion engine, wherein fuel injection takes place during an injection interval in an injection sequence comprising a plurality of individual injections.

12. The method according to claim 1, for controlling a piezo actuator for an injection valve of an internal combustion engine, wherein closed-loop injection quantity control is provided in which a deviation between a wanted fuel injection quantity and an actual fuel injection quantity is measured and taken into account for a subsequent injection for the control thereof.

13. A device for controlling a capacitive load comprising:
means for charging and discharging respectively of the capacitive load by a load current,
wherein the means are operable to effect the charging by consecutive partial charging current pulses corresponding to consecutive partial charging power pulses, and the means are further operable to charge such that the envelope of the partial charging power pulses rises strictly monotonically in an initial phase in which the slope of the envelope falls off monotonically, and a maximum of the envelope is reached at a time instant which is spaced 30% to 70% of the duration of a charging process away from the start of the charging process.

14. The device according to claim 13, comprising means for specifying a time-dependent partial charging energy setpoint value during the charging process and an output stage for generating the partial charging power pulses of the load current whose energy corresponds to the currently specified partial charging energy setpoint value.

15. The device according to claim 14, wherein the means for specifying the time-dependent partial charging energy setpoint value comprise an RC element to which a reference voltage is applied.

16. The device according to claim 13, wherein the means arc further operable to charge such that the envelope of the partial charging power pulses falls strictly monotonically in an end phase in which the slope of the envelope increases monotonically, and the initial phase of the charging process is immediately followed by the end phase of the charging process.

17. The device according to claim 13, wherein more than 10 partial charging current pulses are provided for the charging process.

18. The device according to claim 13, wherein the load current is produced by smoothing a transformer secondary current.

19. The device according to claim 13, wherein the slope in the initial phase of the charging process decreases by at least a factor of 2.

20. The method according to claim 1, wherein the capacitive load is a piezo actuator for an injection valve of an internal combustion engine.

* * * * *